United States Patent [19]

Nakase et al.

[11] Patent Number: 5,438,577
[45] Date of Patent: Aug. 1, 1995

[54] ERROR CORRECTING SYSTEM

[75] Inventors: Junko Nakase, Kokubunji; Nobukazu Doi, Hachioji, both of Japan

[73] Assignee: Hitachi, Ltd., Tokyo, Japan

[21] Appl. No.: 868,708

[22] Filed: Apr. 15, 1992

[30] Foreign Application Priority Data

Apr. 15, 1991 [JP] Japan .................. 3-082229

[51] Int. Cl.⁶ .................. G06F 11/10; H03M 13/00
[52] U.S. Cl. .................. 371/37.1; 371/40.1
[58] Field of Search .............. 371/37.1, 37.5, 38, 371/39, 40.1, 40.2

[56] References Cited

U.S. PATENT DOCUMENTS

| | | | |
|---|---|---|---|
| 4,340,964 | 7/1982 | Sprick et al. | 371/40.1 |
| 4,413,339 | 11/1983 | Riggle et al. | 371/40.1 |
| 4,584,686 | 4/1986 | Fritze | 371/37.1 |
| 4,649,541 | 3/1987 | Lahmeyer | 371/37.1 |

FOREIGN PATENT DOCUMENTS

WOA90-2123  3/1989  WIPO .

OTHER PUBLICATIONS

*Patent Abstracts of Japan*, vol. 10, No. 79 (E-391), Mar. 1986 & JP-A-60 223 334 (NEC) Nov. 7, 1985.

*Primary Examiner*—Roy N. Envall, Jr.
*Assistant Examiner*—Emmanuel Moise
*Attorney, Agent, or Firm*—Antonelli, Terry, Stout & Kraus

[57] ABSTRACT

An error correcting system for performing error correction for error codewords received sequentially in a codeword string on a pipeline processing basis. The system comprises a processing block for generating syndrome data on the basis of parity symbols of each of the codewords, a processing block for performing logical processing operation to derive error locations and error values on the basis of the syndrome data, and a processing block for performing correcting operation for delayed codewords based on the error locations and values. These three processing blocks start their processing operation when receiving individual control signals based on reset signals indicative of leading heads of the respective codewords in the string and delayed by mutually different delay times. With regard to incomplete ones of the codewords that are shorter than a right correct codeword length, the logical processing operation for the error location and error evaluation as well as the error correcting operation is inhibited.

14 Claims, 4 Drawing Sheets

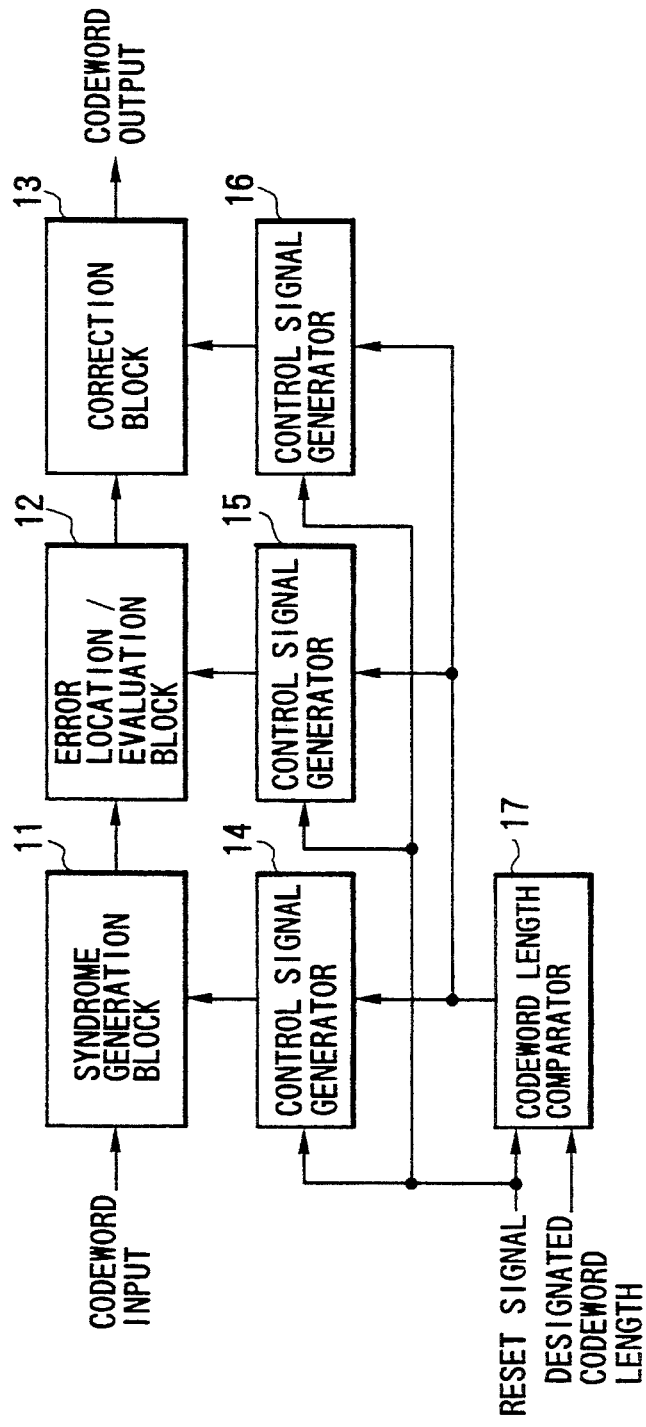
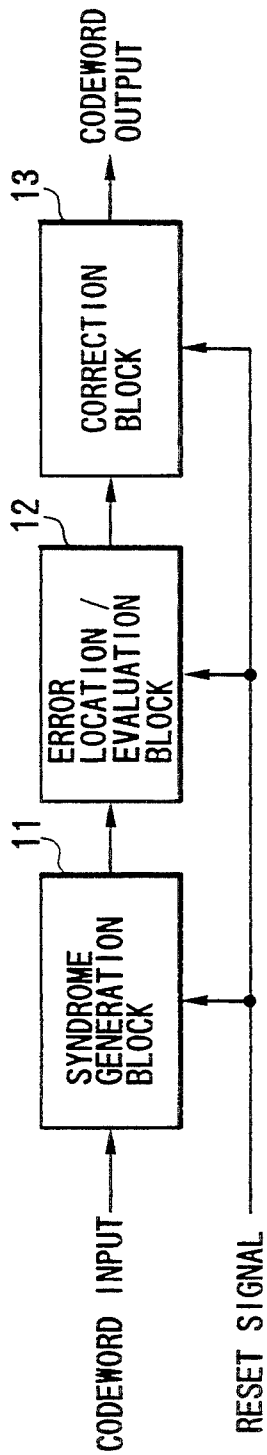

ERROR CORRECTING SYSTEM

BACKGROUND OF THE INVENTION

The present invention generally relates to a system for correcting an error through decoding of an error correction code and, more particularly, to an error correction decoder which performs its error correcting operation on a pipeline processing basis for each code block and which is suitably used in a digital magnetic recording/playback apparatus.

In the case of such a recording medium as magnetic tape on which a digital signal is recorded, when it is desired to play back the recorded data, e.g., "1" and "0", scars, scratches or dust on the tape sometimes cause erroneous playback of them as "0" and "1". As its countermeasure, there has been known a system in which data is divided into a plurality of blocks, each having a predetermined length, and parity data is added to each block to form a codeword for an error correction code and the data is recorded in the form of such codewords. In this case, its playback system includes an error correction decoder which sequentially performs its error correcting operation over each of the codewords read to realize correct playback of the data.

The aforementioned error correcting operation includes a plurality of processing steps of generating a syndrome, deriving an error evaluation polynomial and an error location polynomial and evaluating error locations and error values. In a typical conventional error correction decoder, the decoder has a plurality of blocks which execute the plurality of processing steps respectively as an allocated portion thereof, so that the plurality of blocks perform their pipeline processing operations over a plurality of codewords that are continuously received. Each block, according to a common control signal, transfers its processing result to the next block and starts processing of the next codeword. Such an example is an error correcting system as disclosed in JP-A-60-223334.

FIG. 2 shows a block diagram of a prior art error correcting system disclosed in The Journal of The Institute of Television Engineers of Japan Vol. 43, No. 12 (1989), pp.1333–1339. In the error correcting system, among the aforementioned plurality of processing steps of the error correcting operation, the processing steps of deriving error evaluation/location polynomials and evaluating error locations and values are allocated to an error location/evaluation block 12. More specifically, the error correcting system comprises a syndrome generation block 11, the error location/evaluation block 12 and a correction block 13. The codeword processings of the respective blocks are started under the control of a common reset signal indicative of the leading head of the codeword. Transfer of the codewords between the blocks in the error correcting system is illustrated in FIG. 3. The reset signal is generated by detecting a synchronizing pattern recorded in the leading head of the codewords on a recording medium.

In such a system of correcting an error in each codeword based on the detected synchronizing pattern as mentioned above, generation of an out-of-synchronism condition causes generation of an incomplete codeword that is shorter than the normal codeword. With a helical scan type digital video tape recorder (VTR), in particular, reading operation is undesirably effected across a plurality of tracks having a codeword string recorded therein in a special playback mode, e.g., in a high-speed playback mode. Such a track shift causes an out-of-synchronism condition, thus resulting in generation of an incomplete codeword that is shorter than the normal codeword. At this time, pulse interval in the reset signal is correspondingly shortened. With the above error correcting system, when the reset interval is shortened in this way, the processings of the error location-/evaluation block 12 and correction block 13 are also aborted at the same interval. The codeword then being processed at the error/location/evaluation block is subjected at the correction block 13 to a wrong correcting operation based on intermediate processing values. Further, the codeword issued from the correction block 13 is missing data because the correction block 13 shifts its correcting operation toward the next codeword in the course of its output operation. Such conversion of the codeword data to wrong data based on the wrong correction or data missing is referred to as "mis-correction". Such mis-correction becomes a serious problem, for example, in picture image data because the mis-correction results in deterioration of its picture quality.

SUMMARY OF THE INVENTION

It is therefore an object of the present invention to eliminate such mis-correction problems as in the prior art to improve reproduction data reliability.

In accordance with a first aspect of the present invention, the invention comprises a plurality of processing blocks connected in a cascade arrangement for executing, as allocated, a plurality of stages of error correction processings including at least: generating syndrome symbols on the basis of a read codeword, deriving an error location polynomial and an error evaluation polynomial from the generated syndrome, evaluating error locations and error values according to the error location/evaluation polynomials, and correcting an error in the delayed codeword using the evaluated error locations and error values for output. The plurality of processing blocks start their processings of subsequent ones of the continuous codewords under control of their mutually independent control signals using processing results of the upstream processing blocks. That is, although the error correcting operation is carried out in the plurality of processing blocks on pipeline processing basis, unlike the conventional pipeline operation, the processing of the respective blocks are effected under control of the individual control signals.

More particularly, the invention further includes a monitor unit which monitors, on the basis of a reset signal indicative of the leading head of each codeword in a codeword string, whether or not each codeword has a normal length. Of the plural stages of processing blocks, the processing block for deriving at least error location/evaluation polynomials or for evaluating error locations and values receives the control signal passed through an inhibit gate so as to start its selective processing operation over the codeword determined to be normal in codeword length by the aforementioned monitor unit. The codeword data correction block receives such a control signal that inhibits its correcting operation of a codeword that is shorter than a predetermined codeword length. With such an arrangement, the codewords having the normal length are prevented from being aborted in the course of the processing of the error location/evaluation block and correction block. Accordingly, the aforementioned erroneous correction, which would occurred in the prior art, can be eliminated and thus a mis-correction probability can be reduced. Furthermore, the codeword that is shorter than the normal one can be inhibited from being subjected to such a mis-correction for separate processing.

Other objects and features of the present invention will be clear from the following detailed explanation in conjunction with embodiments with reference to the attached drawings.

BRIEF DESCRIPTION OF THE DRAWINGS

FIG. 1 is a schematic block diagram of an error correcting system in accordance with an embodiment of the present invention;

FIG. 2 is a block diagram of a prior art error correcting system;

DESCRIPTION OF THE PREFERRED EMBODIMENTS

Figure 3:
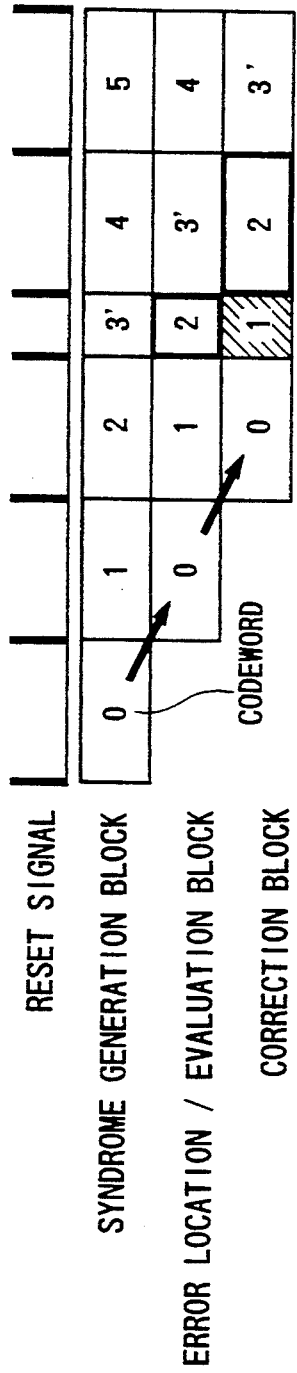
FIG. 3 is a timing chart for explaining how to transfer codewords in the prior art error correcting system.

An embodiment of the present invention will be detailed with reference to the attached drawings.

Referring first to FIG. 1, there is shown a block diagram of an error correcting system in accordance with an embodiment of the present invention for explaining the basic operation of the system. A codeword input signal for an error correcting code having parity symbols for error correction attached to each data block is continuously applied to a syndrome generation block 11 where syndrome data is computed for each block codeword. An error location/evaluation block 12 generates error and error location polynomials, solves them and derives error locations and error values in a data string therefrom. Allocated to the logical processing of the error location/evaluation block 12 is a processing time which corresponds the length of one codeword. A correction block 13, which corrects operation using a derived error locations and error values, corrects the signal train having the input codeword of the syndrome generation block 11 delayed by a time corresponding to the length of two codewords and outputs the data. These three blocks 11, 12 and 13 are controlled by outputs of control signal generation circuits 14 to 16 respectively. That is, the control signal generators 14 to 16 are used to control the flow of data between the blocks 11, 12 and 13. A codeword length comparator 17 compares the interval of a reset signal indicative of the head of the codeword with a designated codeword length to judge whether or not the codeword length is normal. The aforementioned control signal generators 14 to 16 receive, respectively, the reset signal and an output of the codeword length comparator 17, and generate respectively a control signal for associated one of the blocks 11 to 13. With such an arrangement, even when the generation of an incomplete shortened codeword causes generation of a shorter interval of the reset signal, this will not have any influence on the codeword being processed in the error location/evaluation block 12 and the correction block 13.

Figure 4:
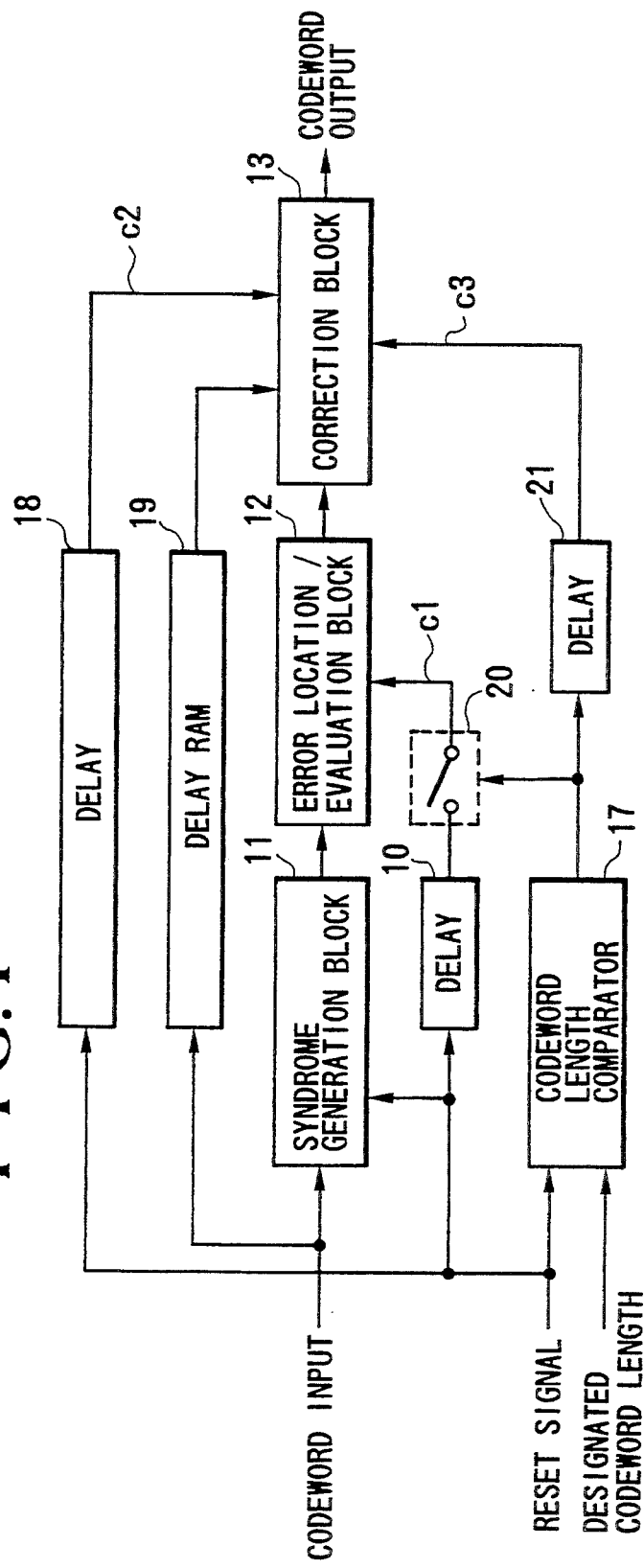
FIG. 4 is a block diagram showing a detailed arrangement of an error correcting system in accordance with another embodiment of the present invention.

Explanation will next be made as to a specific circuit configuration of the embodiment and its operation. FIG. 4 shows a block diagram of the present embodiment, in which the processing contents of the syndrome generation block 11, error location/evaluation block 12 and correction block 13 are the same as those in FIG. 1. A reset signal generator (not shown) detects a synchronizing pattern from the playback signal string to generate a synchronizing signal. The reset signal generator, when failing to detect the synchronizing pattern at the time the designated synchronizing block length elapses after the previous synchronism detection (pull-out), also generates the synchronizing signal and searches for a synchronizing pattern from the subsequent signal string. One synchronizing block consists of two codewords. Accordingly, the reset signal generator produces reset signals respectively indicating the leading heads of the two codewords on the basis of the synchronizing signal. When an pull-out synchronism condition takes place during playback operation, there is generated an incomplete codeword which is shorter than the designated codeword length. The syndrome generation block 11, when receiving the reset signal from the not shown reset signal generator, terminates its syndrome generating operation, stores its result in a buffer and subsequently starts its syndrome generating operation over a newly entered codeword. A control signal C1 for instructing the error location/evaluation block 12 to start its logical operation is obtained by delaying the reset signal by a clock amount corresponding to codeword length N through a delay means 10 and then by passing it through a switch 20. A codeword length comparator 17 monitors the interval of the reset signal and when determining that the reset signal interval is shorter than a codeword length N, issues its output. During the output of the codeword length comparator 17, the switch is at its open position, whereby generation of the control signal C1 is inhibited. During the non-output of the comparator 17, the switch 20 is at its closed position, whereby the delayed reset signal is passed through the switch 20 as the control signal C1. Therefore, the error location/evaluation block 12 performs its error location/evaluating operation over the codeword of the designated codeword length N and does not perform its operation over incomplete codewords that are shorter than the designated codeword length N. On the other hand, a control signal C2 for instructing the correction block 13 to start its processing operation is obtained by delaying the reset signal by a clock amount corresponding to 2 N through a delay means 18. Further, an input signal is also delayed by a clock amount corresponding to 2 N through a delay memory 19 and then applied to the correction block 13. In addition, the correction block 13 receives the error locations and error values calculated at the error location/evaluation block 12 according to the control signal C2. In this way, the correction block 13 sequentially receives, corrects and outputs input signals. During the output period of a control signal C3, however, the correction block 13 does not perform its correcting operation but rather sequentially outputs received input signals in their present form. The control signal C3 is generated by a delay means 21 which shifts an output of the codeword length comparator 17. The delay means 11 is made up of two stages of shift registers which use the control signal C2 as a shift clock. Accordingly, the correction block 13, so long as it receives an incomplete codeword that is shorter than the designated codeword length N, does not perform its correcting operation but rather outputs the original input signal in its present form.

Figure 5:
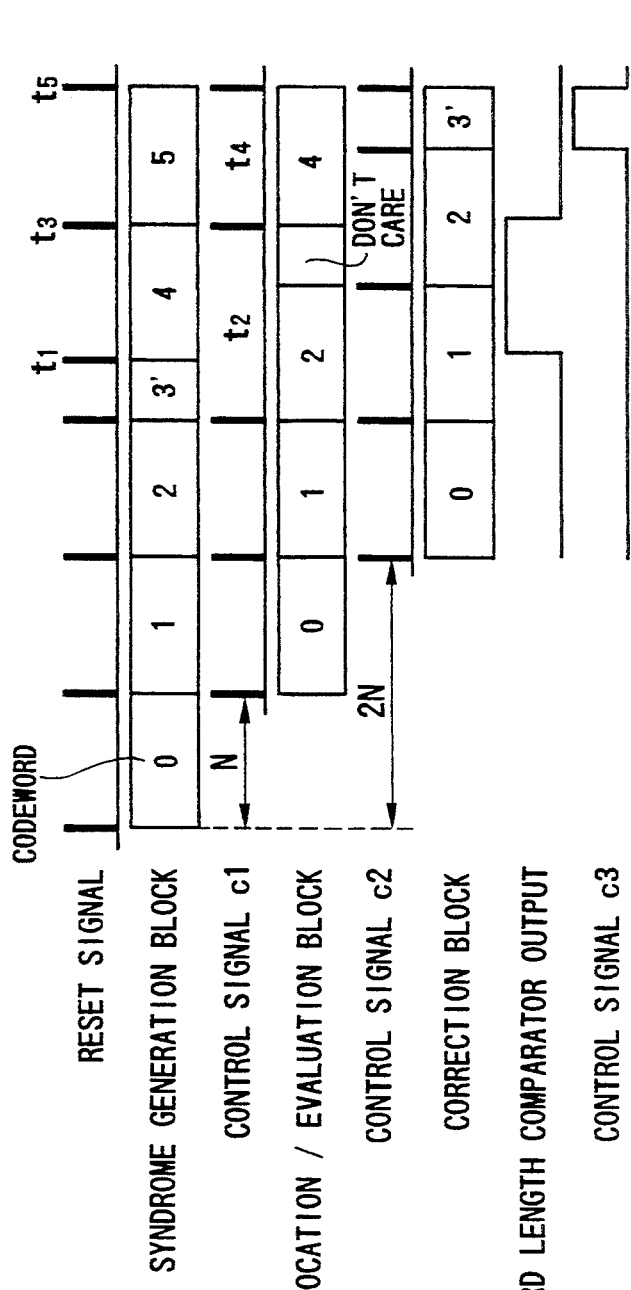
FIG. 5 is a timing chart for explaining how to transfer codewords in the embodiment of FIG. 4.

FIG. 5 shows how the respective blocks perform their processing operation and their propagation states. In FIG. 5, one of sequentially entered codewords designated by 3' is an incomplete codeword that is shorter than the codeword length N. The syndrome generation block 11 sequentially generates syndromes for codewords 0, 1 and 2. Even at a time point t1 when the syndrome generation block 11 terminates its generation of a syndrome for the incomplete codeword 3', the error location/error evaluation block 12 does not yet receive the control signal C1, which results in that the error location/error evaluation block 12 does not interrupt its logical error location/error evaluating operation over the codeword 2. This logical operation is terminated at time point t2 and for a time period from t2 to t4, the error correction block 13 performs its correcting operation over the codeword 2. Therefore, it can be prevented that mis-correction is carried out based on an erroneous error location/error in the course of the logical operation. Since the switch 20 inhibits the output of the control signal C1 at the time point t2, the error location/error evaluation block 12 does not start its logical error location/error evaluating operation over the incomplete codeword 3' and starts its logical operation over a codeword 4 at time point t3. Further, even when the reset signal is issued at time point t1, the correction block 13 continues its correcting and outputting operation over the codeword 1, which results in that no data missing takes place. In a time period from t4 to t5, during which the incomplete codeword 3' that is shorter than the designated codeword length N is output, the control signal C3 inhibits the correcting operation, whereby the codeword 3' is output in its present form. The data not subjected to the correction may be interpolated based on the data of the other normal codewords if necessary. In this way, in accordance with the present embodiment, since erroneous correction, which would has been caused by the processing start control of the respective blocks in the prior art, can be fully prevented, a mis-correction rate or probability can be reduced.

In the present embodiment, a time corresponding to the codeword length N is allocated to the logical processing of the error location/evaluation block 12 and the correction block 12 correspondingly corrects the signal delayed by a clock amount corresponding to 2 N. If the number of clocks necessary for the logical processing of the error location/evaluation block 12 is denoted by $\gamma$ ($\gamma < N$), then a delay for the delay means 18 and the delay memory 19 is expressed by $N + \beta$ ($\gamma \leq \beta \leq N$).

So the contrary, when the logical processing time up to the error location/evaluation is longer than the codeword length N, it becomes necessary to further divide the error location/evaluation block 12 into a plurality of sub-blocks to sequentially proceed a plurality of logical processing stages on a pipeline processing basis.

When input codewords have a fixed period N' which is longer than the codeword length, the reset signal appears at a period N' in a not-out-of-synchronism condition. In this case, the codeword length comparator 17 compares the designated codeword period N' with the period of the reset signal for monitoring. Suppose now that a delay for the delay means 10 is denoted by N' and delays for the delay means 18 and the delay memory 19 are denoted respectively by 2 N'. Or suppose that if a relationship $\gamma < N'$ is satisfied, then a delay for the delay means 18 and the delay memory 19 is denoted by $N' + \beta$ ($\gamma \leq \beta \leq N'$).

Figure 6:
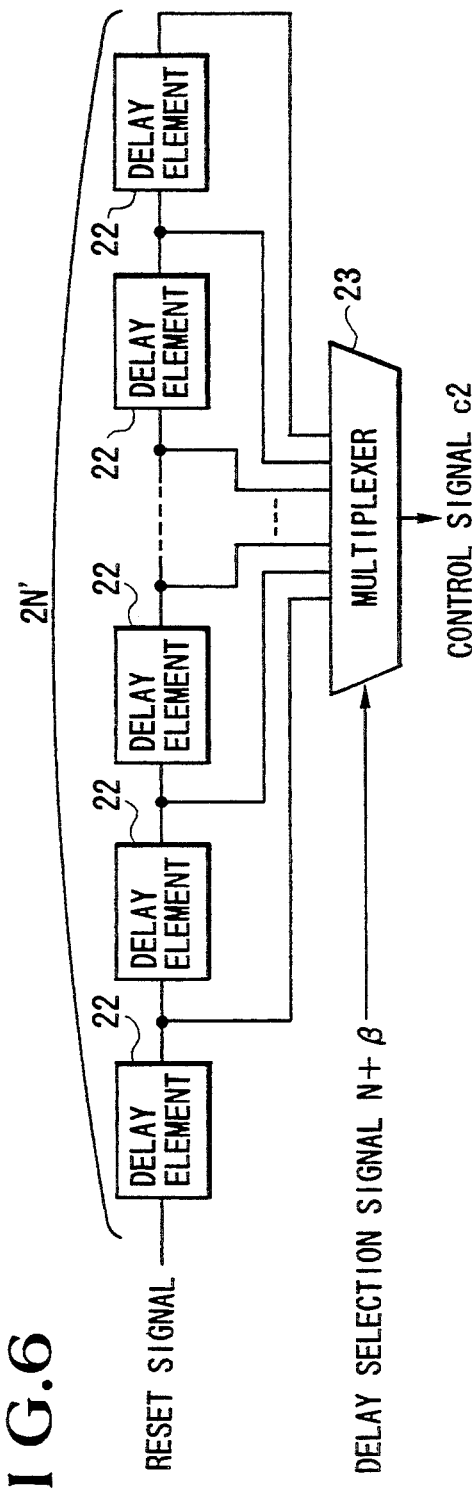
FIG. 6 is a block diagram of an example of a delay means 8 in the embodiment of FIG. 4.

FIG. 6 is an example of the structure of the delay means 18, in which delay elements 22 corresponding in number to twice the maximum designatable codeword length are connected in cascade so that outputs of the respective delay elements 22 are connected to the inputs of a multiplexer 13. For selecting a delay corresponding to $(N + \beta)$, the multiplexer 13 selects the outputs of the delay elements 22 according to a delay selection signal and generates an output as the control signal c2. The control signal c2 is used also as a reading start signal of the delay memory 19 in FIG. 4.

Figure 7:
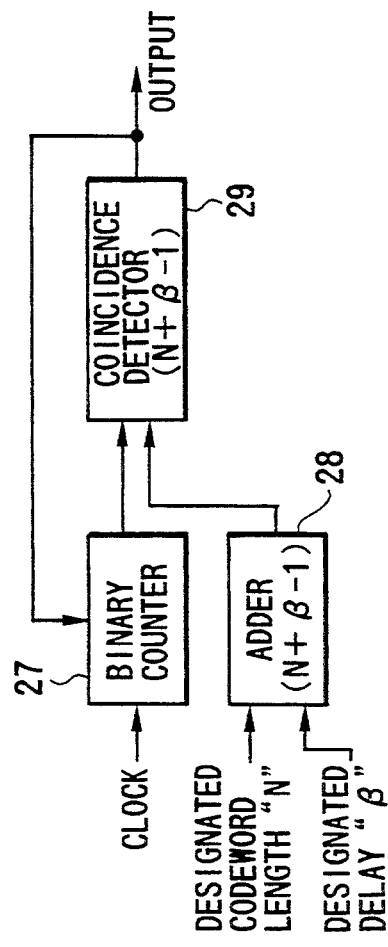
FIG. 7 is a block diagram of another example of the delay means 8 in the embodiment of FIG. 4.

Referring to FIG. 7, there is shown another example of the structure of the delay means 18. In the present embodiment, a random access memory (RAM) 24 is used to delay the reset signal by an amount of $(N + \beta)$. In other words, the RAM 24 performs its reading and writing operations at an identical address during one period of the input clock. An address generation binary counter 25 counts an input clock. An $(N + \beta)$ frequency divider 26 generates a pulse having a period corresponding to $(N + \beta)$ times the clock period and returns the address value of the address generation binary counter 25 to its initial value. That is, the address generation binary counter 25 outputs the same address value to the RAM 24 at a period of $(N + \beta)$. Data read out from the RAM 24 at a given time point is data written in the RAM 24 $(N + \beta)$ clocks before. Accordingly, the RAM 24 delays the reset signal by $(N + \beta)$ clocks to generate the control signal c2. Like the RAM 24, a second RAM for performing its reading and writing operations at an address designated by the binary counter 25 may be provided as the delay memory 19 for codewords.

Figure 8:
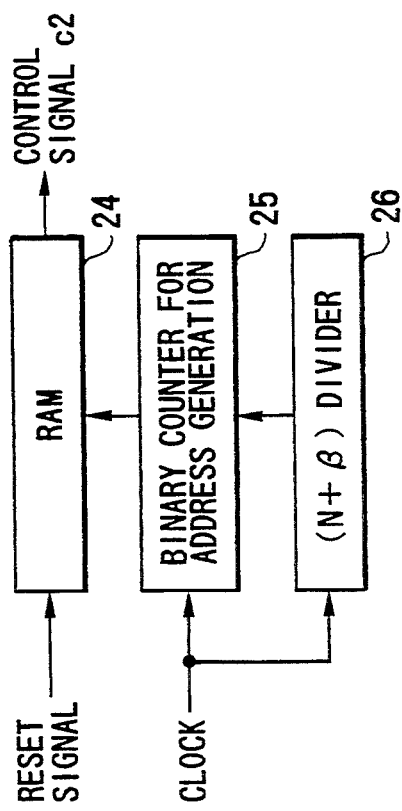
FIG. 8 is a block diagram of an example of an $(N+\beta)$ delay generating circuit 16 in FIG. 7.

FIG. 8 shows an example of the structure of the $(N + \beta)$ frequency divider 26 in FIG. 7. In the drawing, an adder 28 adds the designated codeword length N and a designated delay $\beta$ together to generate a code indicative of a value $(N + \beta - 1)$. A binary counter 27 counts an input clock. A coincidence detecting circuit 29 returns the value of the binary counter 27 to its initial value 0 when the value of the binary counter 27 coincides with $(N + \beta - 1)$. Accordingly, an output of the coincidence detector 29 is a pulse signal having a period of $(N + \beta)$. Such an arrangement may be employed that the binary counter 27 comprises a down counter, the coincidence detector 29 is replaced by a circuit for detecting that the output of the counter becomes "0", and an output of the circuit causes the output $(N + \beta - 1)$ of the adder 28 to be set at the down counter.

Figure 9:
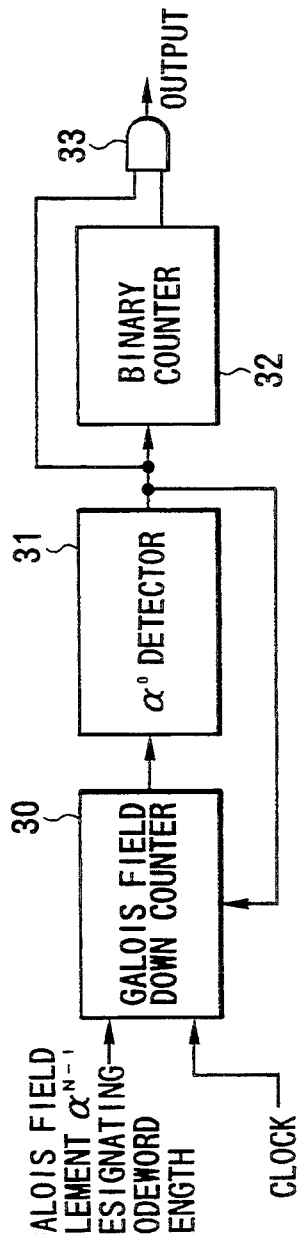
FIG. 9 is a block diagram of another example of the $(N+\beta)$ delay generating circuit 16 in FIG. 7.

FIG. 9 is another example of the structure of the $(N + \beta)$ frequency divider 26 in FIG. 7. In the example, the delay $\beta$ is fixed at the codeword length N, that is, the frequency divider 26 is practically a 2 N frequency divider. Further, the designated codeword length N is provided not directly but in the form of $\alpha^{N-1}$ where $\alpha$ denotes an element on a Galois field. The power number (i) in $\alpha^i$, i.e. the output of the Galois field down counter 30, is decreased by 1 for each clock usually through the multiplication operation on Galois field in a Galois field down counter 30. An $\alpha^0$ detection circuit 31 outputs a pulse when the power number of the element as an output of the Galois field down counter 30 becomes zero. A binary counter 32 inverts its output each time the unit element detector 31 outputs the pulse. An AND gate 33 performs a logical "AND" operation of the output of the $\alpha^0$ detection circuit 31 and the output of the binary counter 32. In other words, the AND gate 33 outputs the output of the $\alpha^0$ detection circuit 31 once for its twice output. Accordingly, a output pulse signal is issued from the AND gate 33 at intervals of 2 N. It is possible to employ such an arrangement that the $\alpha^0$ detection circuit 31 is replaced by a circuit for detecting $\alpha^{N-1}$ so that the output of this detection circuit causes the initial value of the Galois field counter to be returned to $\alpha^0$.

As has been disclosed in the foregoing, in accordance with the present invention, since the mis-correction, which would have occurred in the prior art control, can be eliminated, a mis-correction probability can be reduced. This feature becomes highly effective, in particular, in a high-speed playback mode in which a dummy short codeword is often generated.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. An error correcting system for sequentially reading out a codeword string and correcting errors in each codeword in the codeword string for sequential output thereof, said system comprising:

a plurality of processing blocks connected in cascade for executing, as allocated, a plurality of stages of error correction processing including, at least, generating syndrome data on the basis of parity symbols of a read codeword, deriving an error location polynomial and the error evaluation polynomial to find error locations and error values, and correcting errors in a delayed codeword using the found error locations and error values for output; and control means for generating individual processing control signals for instructing said plurality of processing blocks to start the processing thereof on the basis of reset signals, each reset signal being indicative of a leading head of each of the codewords in the codeword string.

2. An error correcting system as claimed in claim 1, wherein said error correction processing is performed by pipeline processing means using said plurality of processing blocks.

3. An error correcting system according to claim 1, wherein said control means generates said processing control signals so that the processing start times of said plurality of processing blocks do not coincide when a time interval represented by succeeding reset signals differ from a predetermined code word length.

4. An error correcting system according to claim 3, wherein the time interval is shorter than a time interval represented by said predetermined code word length.

5. An error correcting system for sequentially reading out a codeword string and correcting errors in each codeword in the codeword string for sequential output thereof, said system comprising:

a plurality of processing blocks connected in cascade for executing, as allocated, a plurality of stages of error correction processing including, at least generating syndrome data on the basis of parity symbols of a read codeword, deriving an error location polynomial and an error evaluation polynomial from the generated syndrome data, solving the error location polynomial and the error evaluation polynomial to find error locations and error values, and correcting errors in a delayed codeword using the found error locations and error values for output;

first control means for generating a control signal for instructing a first one of said plurality of processing blocks to start the processing thereof on the basis of reset signals each indicative of a leading head of each of the codewords in the codeword string;

monitor means for detecting whether or not a codeword length of each codeword is correct based on a synchronizing signal indicative of the leading head of each of the codewords in said codeword string; and second control means for applying different delays to outputs of said first control means, selecting only one of delayed signals which codeword length is judged as being correct by said monitor means and which corresponds to the head of the codewords, and outputting the control signals to second and subsequent ones of said plurality of processing blocks to instruct starting of processing thereof.

6. An error correcting system as set forth in claim 5, wherein said second control means includes a random access memory in which the outputs of said first control means are written, address generation means for sequentially stepping up an address value for writing or reading operation of said random access memory, and delay means as delay designating means for returning the address value of said address generation means to its initial value at regular intervals.

7. An error correcting system as set forth in claim 6, wherein said delay designating means includes power changing means for receiving a signal indicative of the element $\alpha^{N-1}$ in a Galois field (where N equals codeword length) and changing the power number of the element in the Galois field in sequence and outputting the derived element in the Galois field, power detecting means for detecting that the output of said power changing means becomes a designated value, and counter means for counting the frequency of detections of the designated value through said power detecting means and for outputting an output of said power detecting means once for a constant detection frequency to return said address value to its initial value according to an output of said counter means.

8. An error correcting system as claimed in claim 5, wherein said error correction processing is performed by pipeline processing means using said plurality of processing blocks.

9. An error correcting system for sequentially reading out a codeword string and correcting errors in each codeword in the codeword string for sequential output thereof, said system comprising:

a first processing block for generating syndrome data based on parity symbols of a read codeword;

a second processing block for deriving an error location polynomial and an error evaluation polynomial on the basis of the generated syndrome data and solving said polynomials to perform logical operation to find error locations and error values;

a third processing block for correcting errors in a codeword subjected to a delay corresponding to a predetermined processing time with use of the found error locations and error values;

first control means for generating a first control signal for instructing said first processing block to start the processing thereof on the basis of a reset signal indicative of a leading head of each codeword in said codeword string;

monitor means for comparing an interval in an output of said first control means with a designated interval and, when determining that said first control signal is generated at an interval shorter than said designated codeword length, for generating a monitor signal;

second control means for outputting said first control signal with a delay corresponding to said designated interval, and for inhibiting output of said delayed first control signal in the presence of said monitor signal to generate a second control signal for instructing said second processing block to start logical processing operation thereof; and third control means for outputting said first control signal with a delay corresponding to said predetermined processing time as a third control signal for instructing said third processing block to start processing operation thereof.

10. An error correcting system as set forth in claim 9, further comprising means for delaying said monitor signal to generate an inhibit signal indicative of a period during which an incomplete one of the codewords in said codeword string that is shorter than said designated interval is generated, said inhibit signal inhibiting the error correction of said third processing block.

11. An error correcting system as claimed in claim 5, wherein said error correction processing is performed by pipeline processing means using said plurality of processing blocks.

12. An error correcting system for sequentially reading out a codeword string and correcting errors in each codeword in the codeword string for sequential output thereof, said system comprising:

a first processing block for generating syndrome data based on parity symbols of a read codeword;

a second processing block for deriving an error location polynomial and an error evaluation polynomial on the basis of the generated syndrome data and solving said polynomials to perform a logical operation to find error locations and error values;

a third processing block for correcting errors in a codeword subjected to a delay corresponding to a predetermined processing time using the found error locations and error values;

first control means for generating a first control signal for instructing said first processing block to start the processing thereof on the basis of a reset signal indicative of a leading head of each codeword in said codeword string;

monitor means for comparing an interval in an output of said first control means with a designated codeword length and, when determining that said first control signal is generated at an interval shorter than said designated codeword length, for generating a monitor signal;

second control means for outputting said first control signal with a delay corresponding to said designated codeword length, and for inhibiting output of said delayed first control signal in the presence of said monitor signal to generate a second control signal for instructing said second processing block to start logical processing operation thereof; and third control means for outputting said first control signal with a delay corresponding to said predetermined processing time as a third control signal for instructing said third processing block to start processing operation thereof.

13. An error correcting system as set forth in claim 12, further comprising means for delaying said monitor signal to generate an inhibit signal indicative of a period during which an incomplete one of the codewords in said codeword string that is shorter than said designated codeword length is generated, said inhibit signal inhibiting the error correction of said third processing block.

14. An error correcting system as claimed in claim 12, wherein said error correction processing is performed by pipeline processing means using said plurality of processing blocks.

* * * * *